(12) United States Patent
Oohata et al.

(10) Patent No.: US 6,683,416 B1
(45) Date of Patent: Jan. 27, 2004

(54) DEVICE TRANSFER METHOD, AND DEVICE ARRAY METHOD AND IMAGE DISPLAY UNIT PRODUCTION METHOD USING THE SAME

(75) Inventors: Toyoharu Oohata, Kanagawa (JP); Katsuhiro Tomoda, Kanagawa (JP)

(73) Assignee: Sony Corporation, Tokyo (JP)

( * ) Notice: Subject to any disclaimer, the term of this patent is extended or adjusted under 35 U.S.C. 154(b) by 82 days.

(21) Appl. No.: 10/126,268

(22) Filed: Apr. 19, 2002

(30) Foreign Application Priority Data

Apr. 19, 2001 (JP) .................................. P2001-120477

(51) Int. Cl.⁷ .............................................. G09G 3/10
(52) U.S. Cl. ...................................... 315/169.3; 438/34
(58) Field of Search ......................... 315/169.3, 169.1; 438/34, 128, 28, 30, 40, 43, 689, 738

(56) References Cited

U.S. PATENT DOCUMENTS

| | | | |
|---|---|---|---|
| 5,438,241 A | * | 8/1995 | Zavracky et al. ......... 315/169.3 |
| 5,552,328 A | * | 9/1996 | Orlowski et al. .............. 438/23 |
| 6,204,079 B1 | * | 3/2001 | Aspar et al. ................... 438/25 |
| 6,277,711 B1 | * | 8/2001 | Wu ............................. 438/464 |
| 6,555,408 B1 | * | 4/2003 | Jacobsen et al. ............... 438/34 |
| 6,613,610 B2 | * | 9/2003 | Iwafuchi et al. ............... 438/34 |

FOREIGN PATENT DOCUMENTS

| | | |
|---|---|---|
| JP | 04-247486 | 9/1992 |
| JP | 10-070151 | 3/1998 |
| JP | 11-142878 | 5/1999 |
| WO | WO 95/05623 | 2/1995 |

* cited by examiner

*Primary Examiner*—James Clinger
*Assistant Examiner*—Ephrem Alemu
(74) *Attorney, Agent, or Firm*—Bell, Boyd & Lloyd LLC

(57) ABSTRACT

A method of transferring multiple devices arrayed on a first substrate to a second substrate is provided. The devices on the first substrate are covered with a release agent, and a portion of the release agent, positioned on a device to be transferred is selectively removed. The first substrate is placed on a second substrate in such a manner that the devices arrayed on the first substrate face an adhesive layer previously provided on the second substrate. Only the device from which the release agent has been removed, is irradiated with a laser beam from a back side of the first substrate. The second substrate is then peeled from the first substrate, whereby only the device to be transferred is certainly, efficiently, and accurately transferred from the first substrate to the second substrate.

7 Claims, 8 Drawing Sheets

LASER BEAM

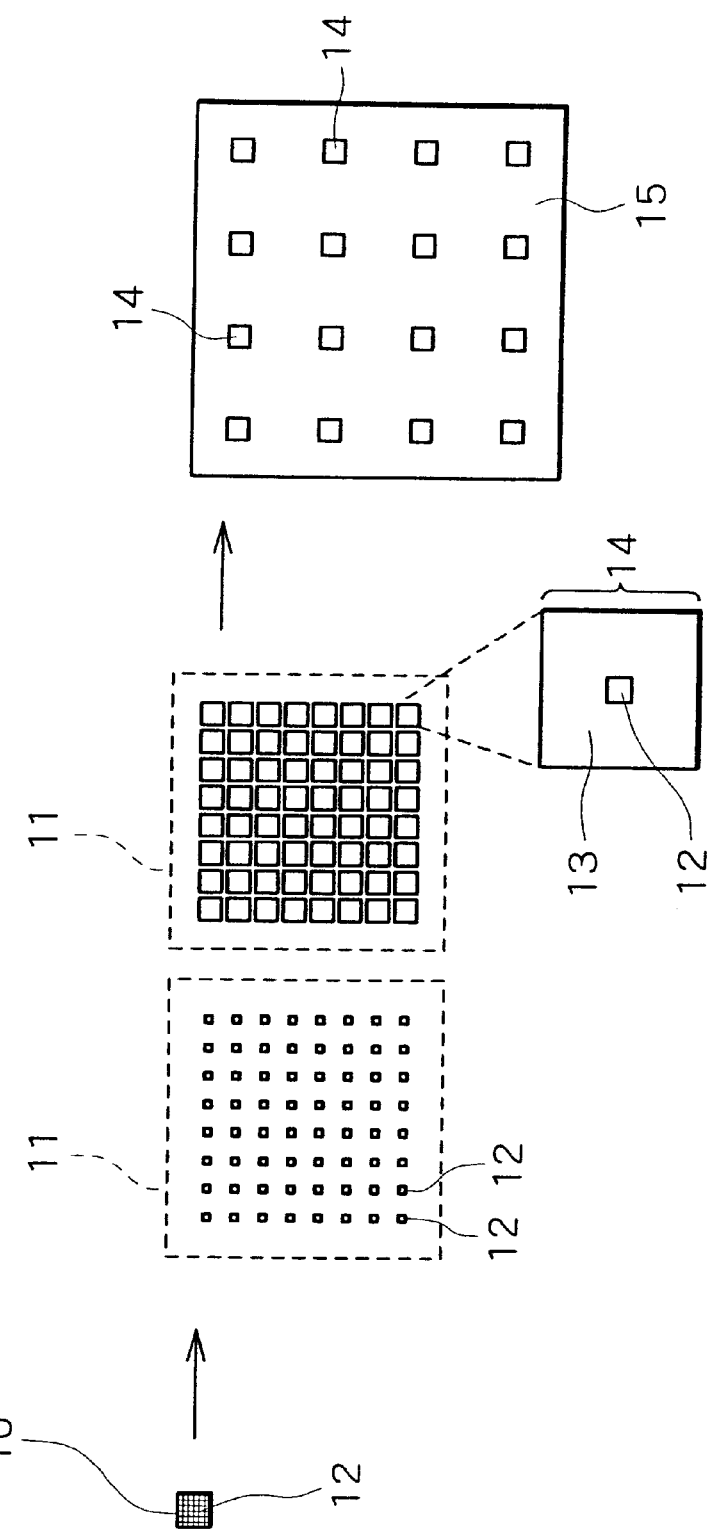

DEVICE TRANSFER METHOD, AND DEVICE ARRAY METHOD AND IMAGE DISPLAY UNIT PRODUCTION METHOD USING THE SAME

BACKGROUND OF THE INVENTION

The present invention relates to a device transfer method of transferring devices such as semiconductor light emitting devices, and to a device array method and an image display unit production method, which are adapted to transfer finely formed devices to a wider region by making use of the device transfer method.

Two methods have generally been employed to produce image display units having light emitting devices arrayed in a matrix. One method, which is used for producing liquid crystal displays (LCDs) or plasma display panels (PDPs), is carried out by directly forming devices on a substrate. The other method, which is used for producing light emitting diode (LED) displays, is carried out by packaging each LED, and arraying the single LED packages on a substrate. In the case LCD or PDP display units, device isolation is impossible due to the structure of the device. Therefore, such devices are generally formed, from the beginning of the production process, in such a manner as to be spaced from each other with a pitch equivalent to a pixel pitch of a final image display unit.

On the other hand, in the case of producing LED displays, LED chips obtained by dicing are individually connected to external electrodes by wire-bonding or bump-connection using flip-chip packaging techniques. In this case, before and after packaging, the LED chips are arrayed with a pitch equivalent to a pixel pitch of the final image display unit; however, such a pixel pitch is independent of the pitch of the devices at the time the devices are formed.

Since LEDs (Light Emitting Diodes) as individual light emitting devices are expensive, an image display unit using LEDs can be produced at a lower cost by producing a number of LEDs from one wafer. To be more specific, the cost of an image display unit can be reduced by preparing LED chips while reducing a size of each LED chip from a conventional size of about 300 $\mu$m square into a size of several ten $\mu$m square, and connecting the LEDs chips to each other, to produce the image display unit.

From this viewpoint, there have been known various techniques of transferring devices densely formed on a substrate to a wide region in a manner such that the devices are spaced further apart from each other in the wide region, thereby obtaining a relatively large display unit such as an image display unit. For example, U.S. Pat. No. 5,438,241 has disclosed a thin film transfer method, and Japanese Patent Laid-open No. Hei 11-142878 has disclosed a method of forming a transistor array panel for display. In the transfer method disclosed in U.S. Pat. No. 5,438,241, devices densely formed on a substrate are coarsely re-arrayed by transferring the devices densely formed on the substrate to an extensible substrate provided with an adhesive layer, extending the extensible substrate in the X direction and the Y direction while monitoring a device array pitch and positions of respective devices, and transferring the devices on the extended substrate onto a desired display panel. In the technique disclosed in Japanese Patent Laid-open No. Hei 11-142878, thin film transistors forming a liquid crystal display portion on a first substrate are all transferred onto a second substrate, and the thin film transistors are selectively transferred from the second substrate to a third substrate in such a manner that the transferred transistors are spaced apart from one another on the third substrate with a pitch corresponding to the pixel pitch of the display unit.

In the case of producing image display units by the above-described transfer techniques, it is required to selectively, certainly transfer only devices to be transferred, and to efficiently, accurately transfer only devices to be transferred.

SUMMARY OF THE INVENTION

An object of the present invention is to provide a device transfer method capable of certainly, efficiently, and accurately transferring, among devices formed on a substrate, only those to be transferred, and a device array method and an image display unit production method using the device transfer method.

To achieve the above object, according to a first aspect of the present invention, there is provided a device transfer method of transferring a number of devices arrayed on a first substrate to a second substrate. The method includes covering the devices on the first substrate with a release agent. A portion of the release agent positioned on a device to be transferred is then selectively removed. The first substrate is then placed on a second substrate in such a manner that the devices arrayed on the first substrate face an adhesive layer previously provided on the second substrate. The device from which the release agent has been removed is then irradiated from a back side of the first substrate, and the second substrate is peeled from the first substrate.

Devices covered with a release agent have small adhesive forces against an adhesive layer by the effect of the release agent, while a device from which the release agent has been removed is adhesively bonded to the adhesive layer with a specific adhesive force. At the same time, since only the device from which the release agent has been removed is irradiated with a laser beam from a back side of a substrate, the device is peeled from the substrate by so-called laser abrasion. As a result, according to the device transfer method of the present invention, only the device from which the release agent has been removed can be readily, selectively transferred to a second substrate side by the adhesive force and the peeling from the substrate by laser abrasion.

According to a second aspect of the present invention, a device array method of re-arraying a plurality of devices, which have been arrayed on a first substrate onto a second substrate is provided. The method includes a first transfer step of transferring the devices from the first substrate to a temporary holding member in such a manner that the devices are enlargedly spaced from each other on the temporary holding member with a pitch larger than a pitch of the devices arrayed on the first substrate. The devices are then held on the temporary holding member. A second transfer step involves transferring the devices held on the temporary holding member to a second substrate in such a manner that the devices are more enlargedly spaced from each other on the second substrate with a pitch larger than a pitch of the devices held on the temporary holding member. The first transfer step further includes the steps of covering the multiple devices on the first substrate with a release agent and selectively removing a portion of the release agent, positioned on a device to be transferred. The transfer step further includes placing the first substrate on the temporary holding member in such a manner that the devices arrayed on the first substrate face an adhesive layer previously provided on the temporary holding member. The transfer step next involves irradiating the device from which the release agent has been removed, from a back side of the first substrate, then peeling the temporary holding member from the first substrate.

With this configuration, since the transfer of devices is efficiently, certainly performed, it is possible to smoothly perform transfers in which the device pitch is enlarged. To be more specific, devices on a first substrate are smoothly transferred to a second substrate via a temporary holding member in such a manner that the devices are enlargedly spaced from each other on the second substrate, having a pitch larger than a pitch of the devices on the first substrate.

According to a third aspect of the present invention, there is provided an image display unit production method of producing an image display unit in which light emitting devices are arrayed in a matrix. The production method involves a first transfer step of transferring light emitting devices from a first substrate to a temporary holding member in such a manner that the light emitting devices are enlargedly spaced from each other on the temporary holding member with a pitch larger than the pitch of the light emitting devices when they are arrayed on the first substrate. The light emitting devices are then held on the temporary holding member. A second transfer step involves transferring the light emitting devices held on the temporary holding member to a second substrate in such a manner that the light emitting devices are more enlargedly spaced from each other on the second substrate, having a pitch that is larger than the pitch of the light emitting devices when they are held on the temporary holding member. A wiring formation step is provided for forming wiring connected to the light emitting devices. To accomplish this the first transfer step further includes the step of covering the plurality of light emitting devices on the first substrate with a release agent. A portion of the release agent positioned on a light emitting device to be transferred is then selectively removed. The first substrate is stuck to the temporary holding member in such a manner that the light emitting devices arrayed on the first substrate face an adhesive layer previously provided on the temporary holding member. The light emitting device from which the release agent has been removed is irradiated from a back side of the first substrate and the temporary holding member is peeled from the first substrate.

Using the above described device transfer method and device array method, it is possible to efficiently, enlargedly re-array light emitting devices, which have been densely formed, that is, finely formed with a high degree of integration, thus, it is possible to significantly improve the productivity of the image display unit.

Additional features and advantages of the present invention are described in, and will be apparent from, the following Detailed Description of the Invention and the figures.

BRIEF DESCRIPTION OF THE FIGURES

FIGS. 6A to 6D are typical views showing a device array method;

DETAILED DESCRIPTION OF THE INVENTION

Hereinafter, a device transfer method, and a device array method and an image display unit production method using the same will be described in detail with reference to the accompanying drawings.

Figure 1:
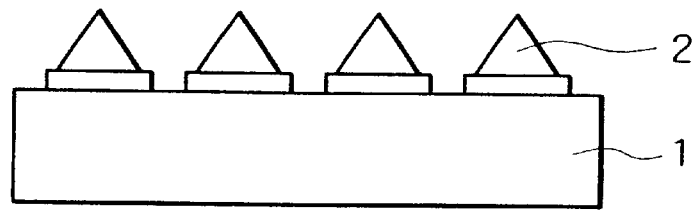
FIG. 1 is a schematic sectional view showing a state in which devices are formed on a first substrate.

The device transfer method, which is basic to the device array method and an image display unit production method, will be first described with reference to FIGS. 1 to 5. Referring to FIG. 1, multiple devices 2 are formed on a first substrate 1 in such a manner as to be suitably arrayed. The first substrate 1 is preferably made from a light permeable material because it is required to irradiate the first substrate 1 from its back surface with a laser beam in a subsequent step.

The device 2 is not particularly limited, and is exemplified by a light emitting device, a liquid crystal control device, a photoelectric transfer device, a piezoelectric device, a thin film transistor device, a thin film diode device, a resistance device, a switching device, a micro-magnetic device, or a micro-optical device.

Figure 2:
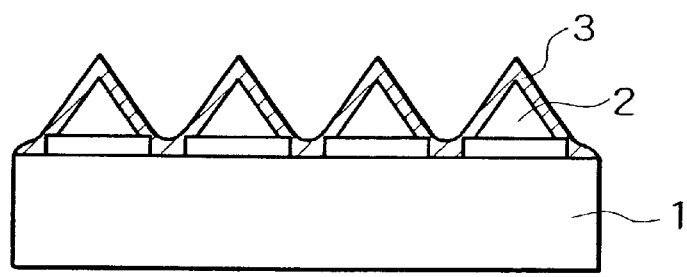
FIG. 2 is a schematic sectional view showing a state in which a release agent layer is formed on the devices.

Referring to FIG. 2, a release agent layer 3 is formed to cover all the devices 2 on the first substrate 1. The release agent layer 3 can be easily formed by coating all the devices 2 on the first substrate 1 with a commercially available mold-release agent. The kind of the release agent is not particularly limited but may be a release agent having good releasability against an adhesive layer to be described later. The release agent preferably has a viscosity low enough to allow the release agent to be uniformly applied to a thickness equal to or less than a size of the device 2. Specifically, the viscosity of the release agent may be generally in a range of about 100 Pa·s or less, and if the release agent is applied by spin coating, the viscosity thereof is preferably in a range of 0.01 to 0.05 Pa·s. The release agent may be applied by spin coat, printing, or spray coating. If the release agent is applied by printing, the viscosity may be high.

The release agent may be selectively removed by laser abrasion, photolithography, or etching. In the case of adopting laser abrasion for selectively removing the release agent, the release agent may be configured to have absorptivity against the wavelength of the laser. In the case of adopting either photolithography or etching for selectively removing the release agent, the release agent may be configured not to be dissolved by an organic solvent used at the time of formation of a resist but to be removed by another solvent or dry etching. As the release agent is capable of meeting the above requirements, there may be typically used a silicon resin. The silicon resin can be applied by spin coat and can be removed by laser abrasion.

Figure 3:
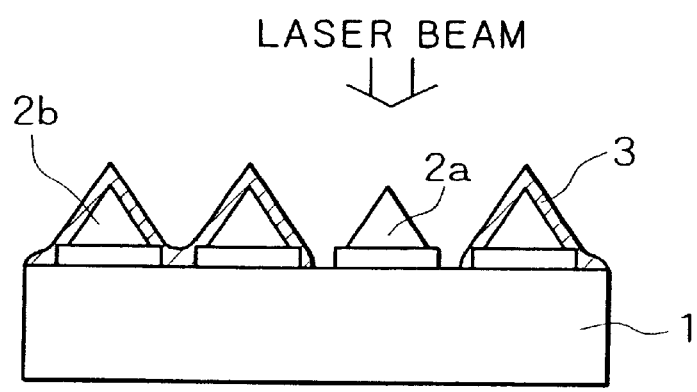
FIG. 3 is a schematic sectional view showing a state in which the release agent layer is selectively removed.

Referring to FIG. 3, only a portion, positioned on the device 2a to be transferred, of the release agent layer 3 is removed. In other words, the other portions, positioned on the devices 2b not to be transferred, of the release agent layer 3 remain. The selective removal of the release agent layer 3 may be performed by selectively irradiating the release agent layer 3 with a laser beam, thereby removing the portion, irradiated with the laser beam, of the release agent layer 3 by laser abrasion. The laser abrasion is a method of peeling a material portion irradiated with a laser beam by utilizing a rapid increase in volume of the material portion. It is generally known that a high polymer material has a high absorptivity against ultraviolet light, and is efficiently abraded when irradiated with an ultraviolet laser beam. The release agent can be subjected to laser abrasion. The portion, positioned on the device 2a to be transferred, of the release agent layer 3 can be removed by a photolithography technique.

Figure 4:
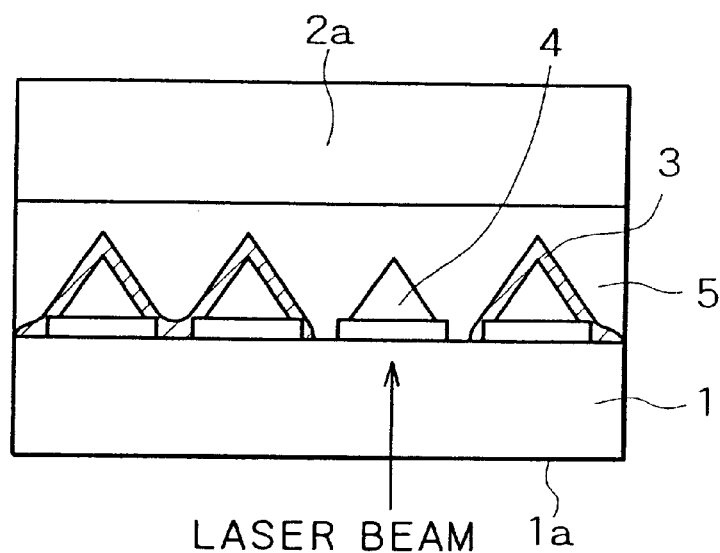
FIG. 4 is a schematic sectional view showing a state in which the first substrate is stuck on a second substrate.

After the portion, positioned on the device 2a to be transferred, of the release agent layer 3 is thus removed, as shown in FIG. 4, the first substrate 1 is stuck with a second substrate 4 on which an adhesive layer 5 is previously formed in such a manner that the devices 2 on the first substrate 1 face to the adhesive layer 5 on the second substrate 4.

At the same time, only the device 2a to be transferred is irradiated with a laser beam from a back surface 1a side of the first substrate 1, to thereby peel the device 2a from the first substrate 1 by laser abrasion. If the devices 2 are semiconductor devices made from a nitride semiconductor such as a GaN based material, then nitrogen contained in the GaN based material is gasified at an interface between the device 2a and the first substrate 1 by irradiation of the interface with the laser beam, whereby the device 2a is peeled from the first substrate 1.

Figure 5:
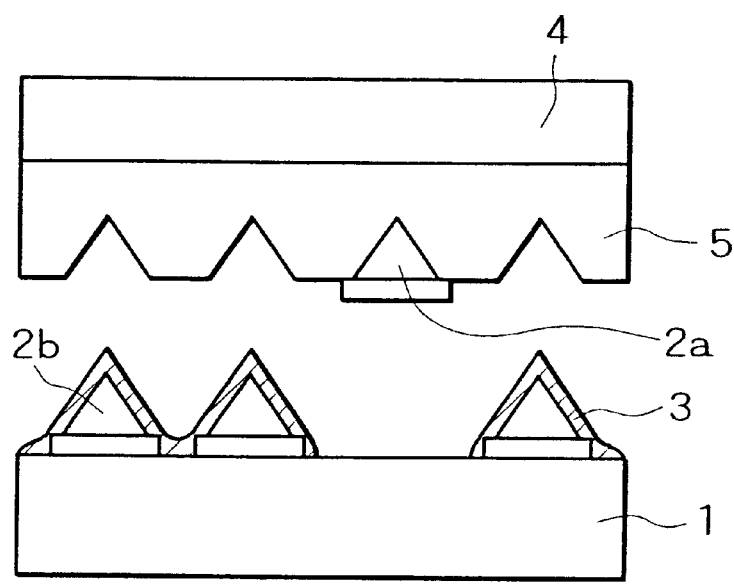
FIG. 5 is a schematic sectional view showing a state in which a selective device is transferred to the second substrate.

The first substrate 1 is then separated from the second substrate 4. This state is shown in FIG. 5, in which only the device 2a to be transferred is transferred onto the adhesive layer 5 on the second substrate 4 by the effect of an adhesive force of the adhesive layer 5, to be thus transferred from the first substrate 1 to the second substrate 4. The remaining devices 2b are not peeled from the first substrate 1, and further, since the release agent layer 3 having releasability against the adhesive layer 5 remains, the remaining devices 2b are not transferred onto the adhesive layer 5.

According to the above-described device transfer method, only the device 2a to be transferred, from which the corresponding portion of the release agent layer 3 is removed, is selectively, certainly transferred to the second substrate 4. The transfer operation is simple and efficient. Further, since the device 2a is fixed to the first substrate 1 until being buried in the adhesive layer 5 and is peeled from the first substrate 1 by laser abrasion while being fixed in the adhesive layer 5, the positional accuracy of the device 2a is desirably kept.

As application examples of the above-described device transfer method, a device array method and an image display unit production method, which are based on a two-step enlarged transfer method, will be described below. The two-step enlarged transfer method, which is applied to the device array method and the image display unit production method, is carried out by transferring devices formed on a first substrate at a high density onto a temporary holding member in such a manner that the devices are spaced from each other with a pitch larger than a pitch of the devices arrayed on the first substrate, and further transferring the devices held on the temporary holding member onto a second substrate in such a manner that the devices are spaced from each other with a pitch larger than the pitch of the devices held on the temporary holding member. It is to be noted that two-step transfer is adopted in this embodiment, however, multi-step transfer such as three or more-step transfer can be adopted in accordance with a required enlargement ratio between the pitch of the devices arrayed on the first substrate and the pitch of the devices mounted on the second substrate.

FIGS. 6A to 6D show basic steps of the two-step enlarged transfer method. First, devices 12 such as light emitting devices are densely formed on a first substrate 10 shown in FIG. 6A. By densely forming devices, the number of devices to be produced per each substrate can be increased, to reduce the cost of final products. As the first substrate 10, there may be used any kind of substrate on which devices can be formed, such as a semiconductor wafer, a glass substrate, a quartz glass substrate, sapphire substrate, or a plastic substrate. The devices 12 may be directly formed on the first substrate 10, or may be formed once on another substrate and then arrayed on the first substrate 10.

As shown in FIG. 6B, the devices 12 are transferred from the first substrate 10 onto a temporary holding member 11 shown by broken lines in the figure, and held on the temporary holding member 11. On the temporary holding member 11, the adjacent two of the devices 12 are spaced from each other, so that the devices 12 are arrayed in a matrix as a whole shown in the figure. To be more specific, the devices 12 are transferred onto the temporary holding member 11 in such a manner as to be enlargedly spaced from each other not only in the X direction but also in the Y direction perpendicular to the X direction. The enlargement ratio between the pitch of the devices on the first substrate 10 and the pitch of the devices on the temporary holding member 11 is not particularly limited, but may be determined, for example, in consideration of formation of resin portions and formation of electrode pads in the subsequent steps. The devices 12 on the first substrate 10 can be all transferred from the first substrate 10 onto the temporary holding member 11 in such a manner as to be enlargedly spaced from each other. In this case, a size of the temporary holding member 11 along each of the X direction and the Y direction may be equal to or more than a value obtained by multiplying the number of the devices arrayed in each of the X direction and the Y direction by the pitch of the devices arrayed on the temporary holding member 11. In addition, part of the devices 12 on the first substrate 10 may be transferred onto the temporary holding member 11 in such a manner as to be enlargedly spaced from each other. It is to be noted that the transfer of the devices 12 onto the temporary holding member 11 is performed by making use of the device transfer method described with reference to FIGS. 1 to 5 as will be described below.

After such a first transfer step, as shown in FIG. 6C, covering of each of the devices 12, enlargedly spaced from each other on the temporary holding member 11, with a resin and formation of an electrode pad on the resin block thus formed are performed. The covering of each device 12 with the resin is performed for facilitating formation of the electrode pad for the device 12 and handling of the device 12 in the subsequent second transfer step. In order to prevent occurrence of a wiring failure in a final wiring step performed after the second transfer step as will be described later, the electrode pad is formed into a relatively large size. It is to be noted that the electrode pads are not shown in FIG. 6C. A resin molded chip 14 formed by covering each device 12 with a resin 13 is shown in FIG. 6C. The device 12 is located at an approximately central portion of the resin molded chip 14 in a plan view according to this embodiment; however, the device 12 may be located at a position offset to one side or a corner of the resin molded chip 14.

Subsequently, as shown in FIG. 6D, a second transfer step is carried out. In this second transfer step, the devices 12, which are arrayed in the matrix on the temporary holding member 11 in the form of the resin molded chips 14, are transferred on a second substrate 15 in such a manner as to be more enlargedly spaced from each other. Like the first transfer step, the transfer of the devices 12 may be performed by adopting specific mechanical means using an attracting jig or an actuator. Alternatively, the devices 12 may be selectively transferred by coating the devices 12 with a resin causing a reaction such as softening, curing, bridging, or deterioration due to heat or light, and locally irradiating selected ones of the devices 12 with heat or light, to thereby peel or adhesively bond the selected devices 12. The transfer of the devices 12 may be performed by combination of the thermal or optical means and the mechanical means.

Even in the second transfer step, adjacent two of the devices 12 in the form of the resin molded chips 14 are more enlargedly spaced from each other, so that the devices 12 are arrayed in a matrix as a whole as shown in the figure. To be more specific, the devices 12 are transferred in such a manner as to be more enlargedly spaced from each other not only in the X direction but also in the Y direction. If the positions of the devices 12 arrayed in the second transfer step correspond to positions of pixels of a final product such as an image display unit, then a pitch of the devices 12 arrayed in the second transfer step is about integer times an original pitch of the devices 12 arrayed on the first substrate 10. Assuming that an enlargement ratio between the pitch of the devices 12 held on the temporary holding member 11 and the pitch of the devices 12 arrayed on the first substrate 10 is taken as "n" and an enlargement ratio between the pitch of the devices 12 arrayed on the second substrate 15 and the pitch of the devices 12 held on the temporary holding member 11 is taken as "m", a value E of the above-described about integer times is expressed by E=n×m.

The devices 12 in the form of the resin molded chips 14, which are more enlargedly spaced from each other on the second substrate 15, are then subjected to wiring. The wiring is performed with care taken not to cause a connection failure by making use of the previously formed electrode pads or the like. If the devices 12 are light emitting devices such as light emitting diodes, then the wiring includes wiring to p-electrodes and n-electrodes. If the devices 12 are liquid crystal control devices, the wiring includes wiring to selective signal lines, voltage lines, alignment electrode films, and the like.

In the two-step enlarged transfer shown in FIGS. 6A to 6D, covering of each device 12 with the resin and formation of each electrode pad can be performed by making use of the spacing between adjacent two of the devices 12 after first transfer, and after second transfer, wiring can be performed without occurrence of any connection failure by making use of the previously formed electrode pads and the like. Accordingly, it is possible to improve the production yield of the image display unit. Further, the two-step enlarged transfer method according to this embodiment includes the two steps in each of which the devices are enlargedly spaced from each other. By carrying out such a plurality of enlarged transfer steps, the number of transfer can be actually reduced. For example, assuming that an enlargement ratio between the pitch of the devices 12 on the temporary holding member 11 and the pitch of the devices 12 on the first substrate 10 is taken as 2 (n=2) and an enlargement ratio between the pitch of the devices 12 on the second substrate 15 and the pitch of the devices 12 on the temporary holding member 11 is taken as 2 (m=2), the total transfer magnification becomes 2×2=4. To realize the total transfer magnification of 4, according to a one-step transfer method, the number of transfer (alignment) of the devices 12 from the first substrate 10 to the second substrate 15 becomes 16 ($=4^2$) times. On the contrary, to realize the same total transfer magnification of 4, according to the two-step enlarged transfer method of this embodiment, the number of transfer (alignment) is obtained by adding a square of the enlargement ratio of 2 in the first transfer step (that is, $2^2=4$) to a square of the enlargement ratio of 2 in the second transfer step (that is, $2^2=4$), and therefore, the number of transfer becomes 8 (=4 +4). To be more specific, letting the enlargement ratios in the first and second steps be "n" and "m", respectively, according to the two-step enlarged transfer method, to achieve the total transfer magnification of n×m, the total number of transfer becomes ($n^2+m^2$) times; while according to one-step transfer method, to achieve the same transfer magnification of n×m, the number of transfer becomes $(n+m)^2=n^2+2$ nm+$m^2$. As a result, according to the two-step enlarged transfer method, the number of transfer can be made smaller than that according to the one-step transfer method by 2 nm times, thereby correspondingly saving time and cost required for the production step. This becomes more significant as the transfer magnification becomes larger.

In the two-step enlarged transfer method shown in FIGS. 6A to 6D, the device 12 is configured as a light emitting device or a liquid crystal control device; however, the device 12 is not limited thereto but may be a device selected from a photoelectric transfer device, a piezoelectric device, a thin film transistor device, a thin film diode device, a resistance device, a switching device, a micro-magnetic device, and a micro-optical device, or part of the device, or a combination thereof.

Figure 7A:
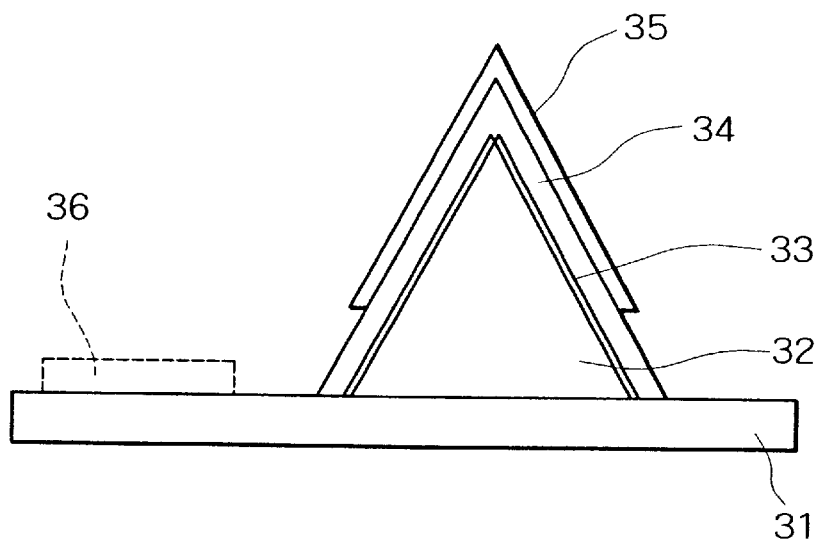
FIGS. 7A and 7B are a sectional view and a plan view showing one example of a light emitting device, respectively.
Figure 7B:
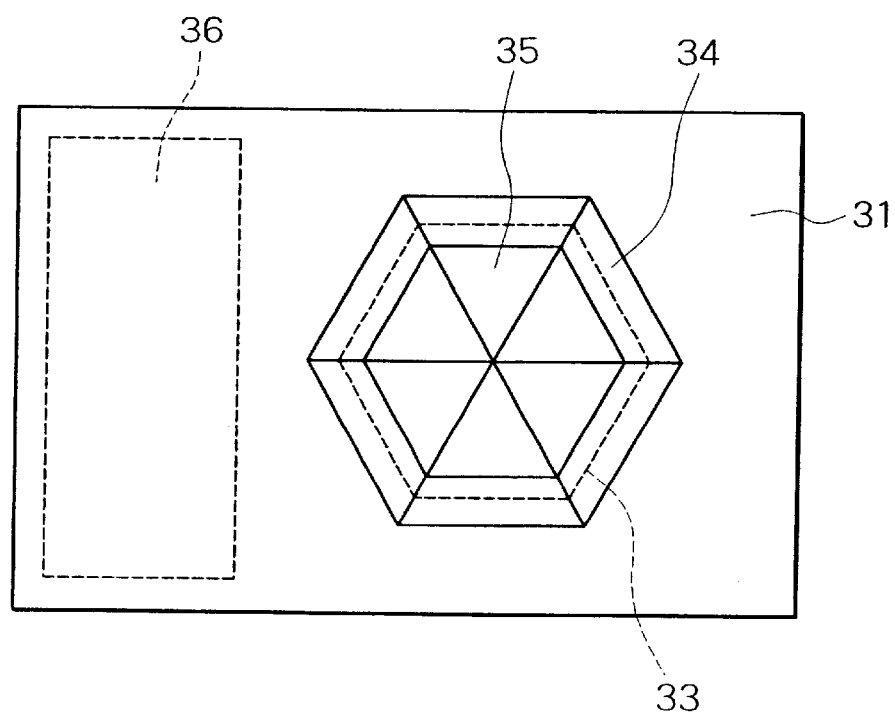

FIGS. 7A and 7B show a structure of a light emitting device as one example of a device used in this embodiment, wherein FIG. 7A is a sectional view of the device and FIG. 7B is a plan view of the device. The light emitting device shown in the figure is a GaN based light emitting diode formed, for example, on a sapphire substrate by crystal growth. In this GaN based light emitting diode, there occurs laser abrasion by irradiation of a laser beam passing through the substrate, to generate a phenomenon in which nitrogen of GaN is evaporated, thereby causing film peeling at an interface between the sapphire substrate and a GaN based growth layer, with a result that device peeling can be easily performed.

The GaN based light emitting diode has a structure in which a hexagonal pyramid shaped GaN layer 32 is formed by selective growth on an under growth layer 31 composed of a GaN based semiconductor layer. While not shown, an insulating film is formed on the under growth layer 31, and the hexagonal pyramid shaped GaN layer 32 is formed from an opening formed in the insulating film by a MOCVD process or the like. The GaN layer 32 is a growth layer formed into a pyramid shape covered with an S-plane, that is, (1-101) plane when a principal plane of a sapphire substrate used at the time of growth is taken as a C-plane. The GaN layer 32 is a region doped with silicon. The tilt S-plane portion of the GaN layer 32 functions as a cladding portion of a double-hetero structure. An InGaN layer 33 functioning as an active layer is formed in such a manner as to cover the tilt S-plane of the GaN layer 32. A GaN layer 34 doped with magnesium is formed on the InGaN layer 33. The GaN layer 34 doped with magnesium also functions as a cladding portion.

Figure 12:
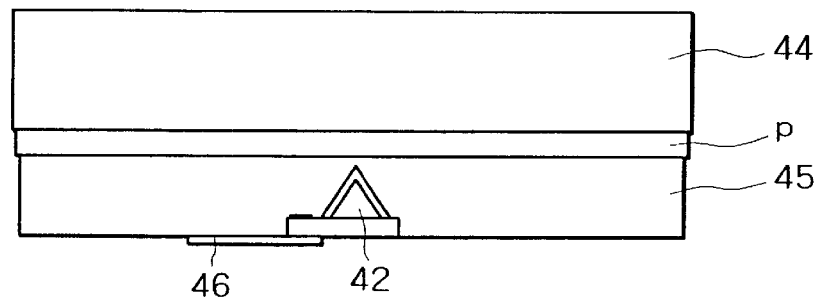
FIG. 12 is a schematic sectional view showing an electrode pad formation step.

The light emitting diode has a p-electrode 35 and an n-electrode 36. A metal material such as Ni/Pt/Au or Ni(Pd)/Pt/Au is vapor-deposited on the GaN layer 34 doped with magnesium, to form the p-electrode 35. A metal material such as Ti/Al/Pt/Au is vapor-deposited in an opening formed in the above-described insulating film (not shown), to form the n-electrode 36. In the case of extracting an n-electrode from a back surface side of the under growth layer 31 as shown in FIG. 12, it is not required to form the n-electrode 36 on the front surface side of the under growth layer 31.

The GaN based light emitting diode having such a structure enables light emission of blue. In particular, such a light emitting diode can be relatively simply peeled from the sapphire substrate by laser abrasion. In other words, the diode can be selectively peeled by selective irradiation of a laser beam. In addition, the GaN based light emitting diode may have a structure in which an active layer be formed in a planar or strip shape, or may be a pyramid with a C-plane formed on an upper end portion of the pyramid. The GaN light emitting diode may be also replaced with any other nitride based light emitting device or a compound semiconductor device.

A method of arraying light emitting devices will be described below with reference to FIGS. 8 through 17. As the light emitting device, the GaN based light emitting diode shown in FIGS. 7A and 7B is used.

Figure 8:
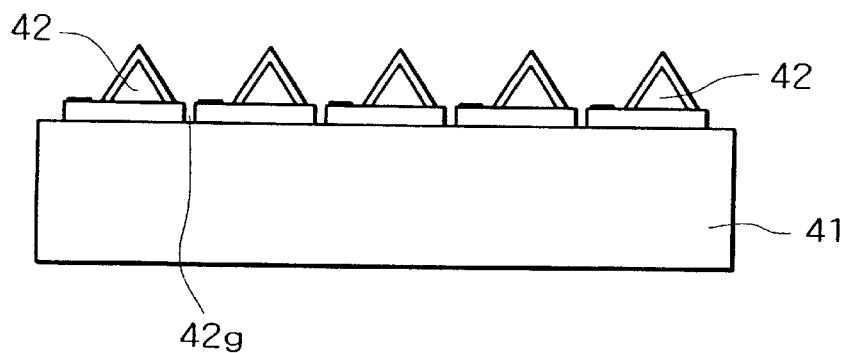
FIG. 8 is a schematic sectional view showing a state in which light emitting diodes are formed on a first substrate.

First, as shown in FIG. 8, a plurality of light emitting diodes 42 are formed in a matrix on a principal plane of a first substrate 41. A size of the light emitting diode 42 is set to about 20 μm. The first substrate 41 is made from a material having a high permeability against a wavelength of a laser beam used for irradiation of the light emitting diode 42, for example, sapphire. The light emitting diode 42 is already provided with a p-electrode and the like but is not subjected to final wiring. Grooves 42g for device isolation are formed to allow the light emitting diodes 42 to be isolated from each other. The grooves 42g are formed, for example, by reactive ion etching. Such a first substrate 41 is opposed to a temporary holding member 44 for selective transfer therebetween.

Figure 9:
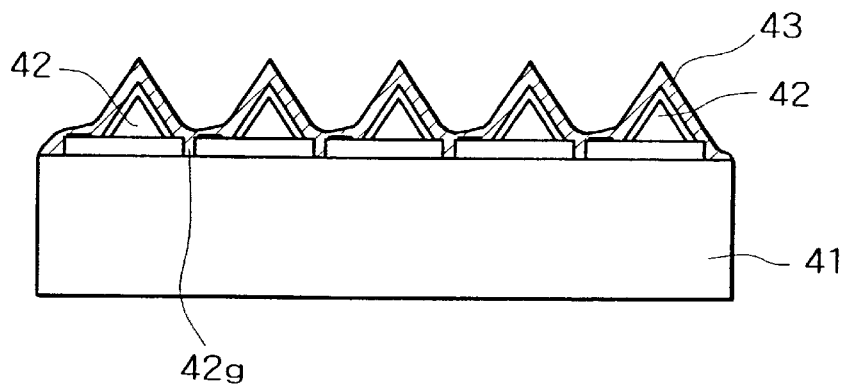
FIG. 9 is a schematic sectional view showing a state in which a release agent layer is formed on the light emitting diodes.

The selective transfer is performed by making use of the above-described device transfer method described with reference to FIGS. 1 to 5. Referring to FIG. 9, a release agent layer 43 is formed to cover all the light emitting diodes 42 on the first substrate 41. As a release agent used for the release agent layer 43, there may be used a fluorine coat, a silicon resin, a water-soluble adhesive (for example, PVA), or polyimide.

Figure 10:
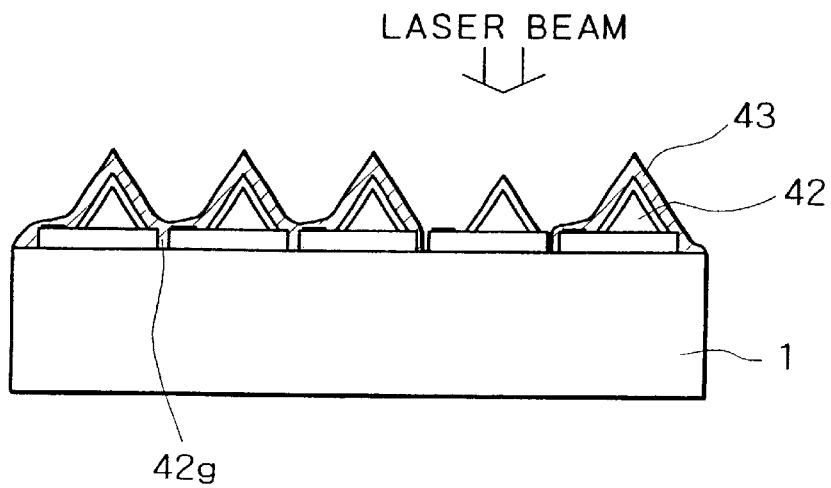
FIG. 10 is a schematic sectional view showing a state in which the release agent layer is selectively removed.

Referring to FIG. 10, a portion, positioned on the light emitting diode 42 to be transferred, of the release agent layer 43 is removed, and the other portions, positioned on the light emitting diodes 42 not to be transferred, of the release agent layer 43 remain. The portion of the release agent layer 43 is removed by selectively irradiating the portion with a laser beam, thereby removing the portion by laser abrasion, or removed by the photolithography technique.

Figure 11:
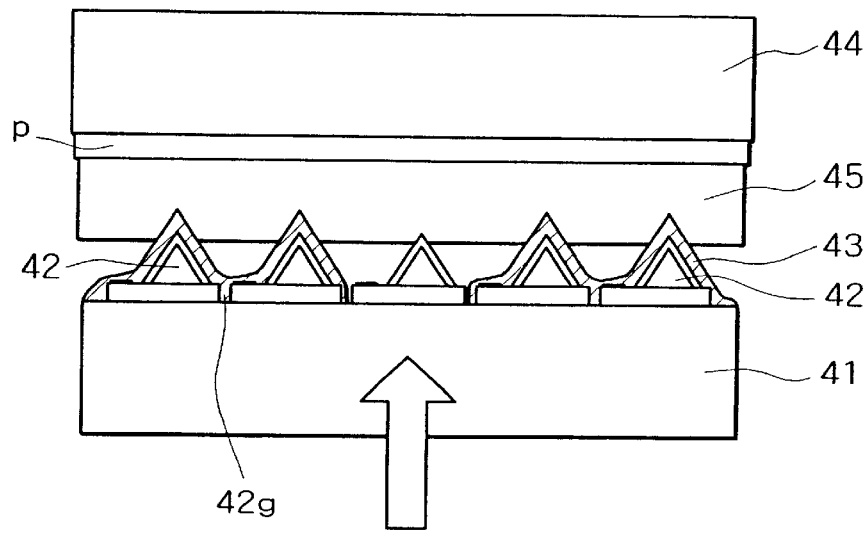
FIG. 11 is a schematic sectional view showing a first transfer step.

Referring to FIG. 11, an adhesive layer 45 is formed, via a release layer p, on a surface, opposed to the first substrate 41, of the temporary holding member 44. As the temporary holding member 44, there may be used a glass substrate, a quartz glass substrate, a sapphire substrate, or a plastic substrate. The adhesive layer 45 on the temporary holding member 44 may be made from an ultraviolet (UV)-curing type adhesive, a thermosetting type adhesive, or a thermoplastic type adhesive. As one example, a quartz glass substrate is used as the temporary holding member 44, which is coated with a UV-curing type adhesive layer to a thickness of about 20 μm, to form the adhesive layer 45.

As shown in FIG. 11, after the alignment of the first substrate 41 to the temporary holding member 44, the light emitting diode 42 to be transferred is irradiated with a laser beam from a back surface of the first substrate 41, and is peeled from the first substrate 41 by laser abrasion. Since the GaN based light emitting diode 42 is decomposed into Ga and nitrogen at an interface between the light emitting diode 42 and sapphire, the light emitting diode 42 can be relatively easily peeled from the first substrate 41. The kind of the laser beam may be an excimer laser beam or a harmonic YAG laser beam.

The light emitting diode 42, which has been selectively irradiated with a laser beam, is peeled from the first substrate 41 at the interface between the GaN layer and the first substrate 41 by laser abrasion, and is transferred to the opposed temporary holding member 44 in such a manner that the p-electrode portion of the light emitting diode 42 is pieced in the corresponding adhesive layer 45. With respect to the remaining light emitting diodes 42, the release agent layer 43 remains on the diodes 42 and thereby the adhesive force of the adhesive layer 45 does not act on the diodes 42, and further the diodes 42 have been not irradiated with the laser beams, with a result that the remaining diodes 42 are not transferred onto the temporary holding member 44. It is to be noted that in the example shown in FIG. 11, only one light emitting diode 42 is selectively irradiated with a laser beam; however, in actual, the light emitting diodes 42 spaced from each other with an n-pitch are irradiated with laser beams. With such selective transfer, the light emitting diodes 42 are transferred on the temporary holding member 44 in such a manner as to be enlargedly spaced from each other with a pitch larger than the pitch of the diodes 42 on the first substrate 41.

In the state that the light emitting diode 42 is held by the adhesive layer 45 of the temporary holding member 44, a back surface of the light emitting diode 42, which is taken as an n-electrode side (cathode electrode side), is cleaned for removal of the resin (adhesive) therefrom. Accordingly, by forming an electrode pad 46 as shown in FIG. 12, the electrode pad 46 is electrically connected to the back surface of the light emitting diode 42.

As one example of cleaning of the adhesive layer 45, the resin for the adhesive is etched with oxygen plasma and cleaned by irradiation of UV ozone. If the GaN based light emitting diode is peeled from the first substrate 41 made from sapphire by irradiation of a laser beam, Ga is deposited on the peeling plane. Such an element Ga must be etched with a NaOH containing water solution or dilute nitric acid.

After that, the electrode pad 46 is patterned. At this time, the electrode pad on the cathode side can be formed into a size of about 60 μm square. As the electrode pad 46, there can be used a transparent electrode (ITO or ZnO based electrode) or a Ti/Al/Pt/Au electrode. In the case of using a transparent electrode, even if the electrode largely covers the back surface of the light emitting diode, it does not shield light emission, so that a patterning accuracy of the electrode may be low and further the size of the electrode can be made large, with a result that it is possible to facilitate the patterning process.

Figure 13:
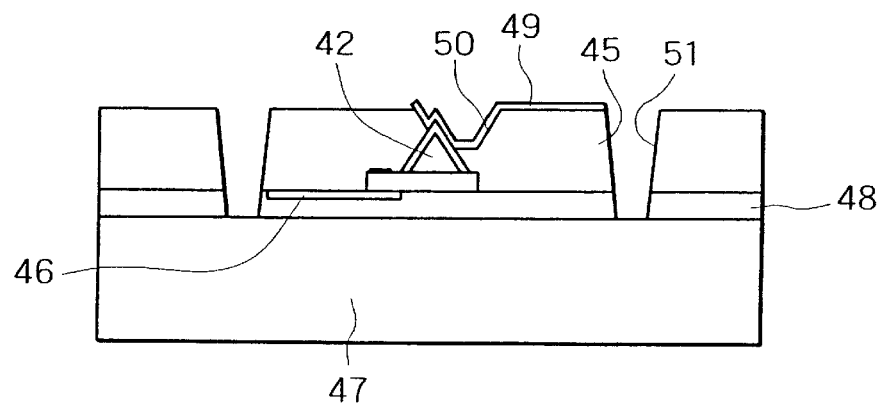
FIG. 13 is a schematic sectional view showing another electrode pad formation step after the light emitting diode is transferred to a second substrate.

FIG. 13 shows a state in which after the light emitting diode 42 is transferred from the temporary holding member 44 to a second temporary holding member 47 and a via-hole 50 on an anode electrode (p-electrode) side is formed in the adhesive layer 45, an anode side electrode pad 49 is formed so as to be connected to the light emitting diode 42 via the via-hole 50 and the adhesive layer 45 made from the resin is diced. As a result of dicing, grooves 51 for device isolation are formed, to isolate the light emitting diodes 42 from each other. To isolate the light emitting diodes 42 arrayed in a matrix from each other, the grooves 51 for device isolation have a planar pattern composed of a plurality of parallel lines extending in the vertical and horizontal directions. The bottom of each groove 51 for device isolation faces to the surface of the second temporary holding member 47.

A release layer 48 is formed on the second temporary holding member 47. The release layer 48 can be formed by using a fluorine coat, a silicon resin, a water-soluble adhesive (for example, PVA), or polyimide. The second temporary holding member 47 is exemplified by a so-called dicing sheet composed of a plastic substrate coated with an UV adhesive whose adhesive strength becomes weak at the time of irradiation of ultraviolet light.

In the process shown in FIG. 13, to transfer the light emitting diode 42 from the temporary holding member 44 to the second temporary holding member 47, irradiation of an excimer laser beam is performed from a back surface, on which the release layer p has been formed, of the temporary holding member 44. With this irradiation of the excimer laser beam, if the release layer p is made from polyimide, peeling occurs at an interface between polyimide and the quartz substrate by abrasion of polyimide, whereby the light emitting diode 42 is transferred onto the second temporary holding member 47.

In one example of the anode electrode forming process, the surface of the adhesive layer 45 is etched with oxygen plasma until the surface of the p-electrode on the light emitting diode 42 is exposed. The via-hole 50 can be formed by using an excimer laser, a harmonic YAG laser beam, or a carbon dioxide laser beam. The diameter of the via-hole is set to about 3 to 7 μm. The anode side electrode pad is made from Ni/Pt/Au or the like. The dicing process may be performed by using a general blade, and if a narrow cut-in width of 20 μm or less is required, the dicing process may be performed by laser cutting. The cut-in width is dependent on the size of the light emitting diode 42 covered with the adhesive layer 45 made from the resin in a pixel of an image display unit. As one example, grooves are formed by an excimer laser beam, to form the chip shape.

Figure 14:
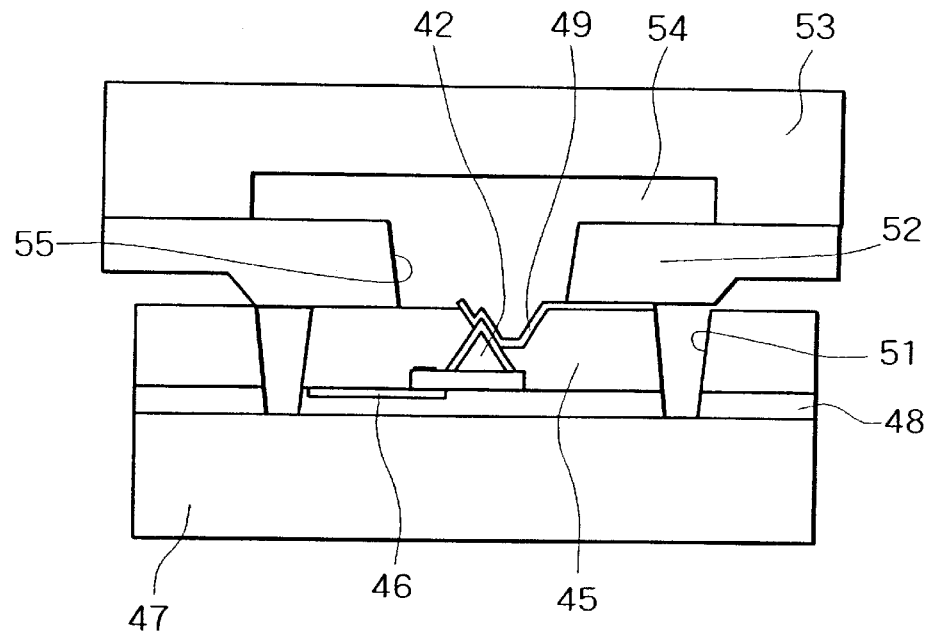
FIG. 14 is a schematic sectional view showing a device attracting step.

After the release layer 48 provided on the second temporary holding means 47 is peeled by irradiation of an excimer laser beam, the light emitting diode 42 is then peeled from the second temporary holding member 47 by using mechanical means. FIG. 14 shows a state in which the light emitting diodes 42 arrayed on the second temporary holding member 47 are picked up by an attracting system 53. The attracting system 53 has attracting holes 55 opened in a matrix corresponding to a pixel pitch of an image display unit in order to collectively attract a number of the light emitting diodes 42. The attracting holes 55, each having an opening diameter of about 100 μm, are arranged with a pitch of 600 μm, and the attracting system 53 can collectively attract 300 pieces of the light emitting diodes 42. The portion of the attracting hole 55 is produced from Ni by electroforming, or forming a hole in a metal plate such as a SUS plate 52 by etching. An attracting chamber 54 is formed at the depth of the attracting hole 55 formed in the metal plate 52. The control of the pressure in the attracting chamber 54 into a negative pressure allows the attracting system 53 to attract the light emitting diode 42. Since each light emitting diode 42 is in a state being covered with the adhesive layer 45 whose surface is nearly flatted, the selective attraction of the light emitting device 42 by the attracting system 53 can be facilitated.

Figure 15:
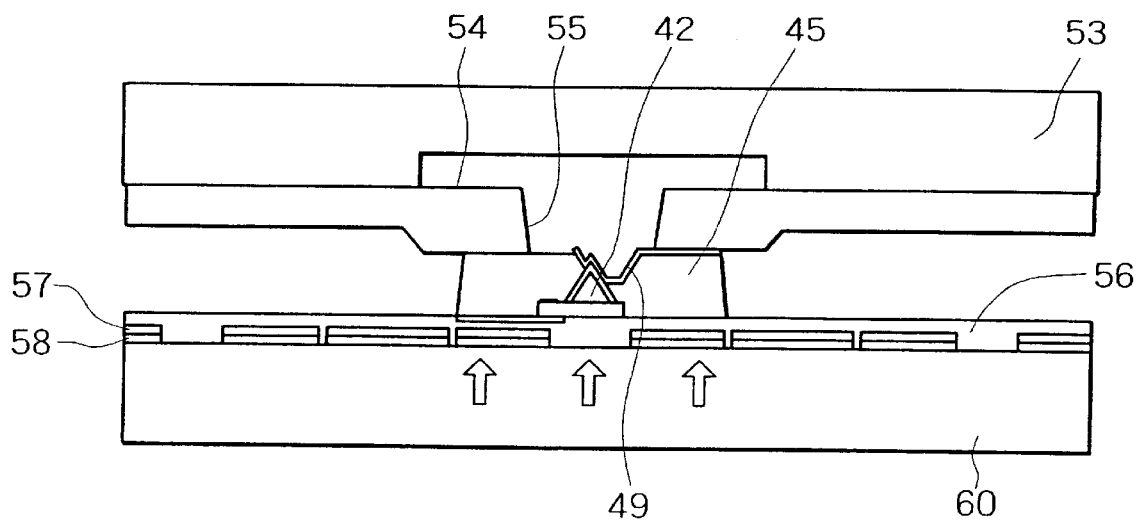
FIG. 15 is a schematic sectional view showing a second transfer step.

FIG. 15 is a view showing a state in which the light emitting diode 42 is transferred to a second substrate 60. An adhesive layer 56 is previously formed on the second substrate 60. By curing a portion, positioned under the light emitting diode 42, of the adhesive layer 56, the light emitting diode 42 can be fixedly arrayed on the second substrate 60. At the time of this mounting, the pressure of the attracting chamber 54 of the attracting system 53 becomes high, to release the attraction of the light emitting diode 42 to the attracting system 53. The adhesive layer 56 is made from an UV-curing type adhesive, a thermosetting adhesive, or a thermoplastic adhesive. The light emitting diodes 42 thus arrayed on the second substrate 60 are more enlargedly spaced from each other with a pitch larger than a pitch of the light emitting diodes 42 held on each of the temporary holding members 43 and 47. An energy for curing the resin of the adhesive layer 56 is given from the back surface of the second substrate 60. A portion, positioned under the light emitting diode 42, of the adhesive layer 56 is cured by using ultraviolet light if the adhesive layer 56 is made from an UV-curing type adhesive, or using a laser beam if the adhesive layer 56 is made from a thermosetting adhesive; or the portion of the adhesive layer 56 is melting by laser irradiation if the adhesive layer 56 is made from a thermoplastic adhesive, to be bonded to the light emitting diode 42.

An electrode layer 57, which also functions as a shadow mask, is disposed on the second substrate 60. In particular, a black chromium layer 58 is formed on a surface, on the screen side, that is, on the viewer side, of the electrode layer 57. This makes it possible to improve the contrast of an image, and to increase an energy absorption efficiency at the black chromium layer 58 and hence to early cure a portion, selectively irradiated with a beam 73, of the adhesive layer 56 (or to early melt the portion, selectively irradiated with a beam 73, of the adhesive layer 56, if the adhesive layer 56 is made from a thermoplastic adhesive). If the adhesive layer 56 is made from an UV-curing type adhesive, the portion, corresponding to the light emitting diode 42 to be transferred, of the adhesive layer 56 is irradiated with ultraviolet light having an energy of about 1000 mJ/cm$^2$.

Figure 16:
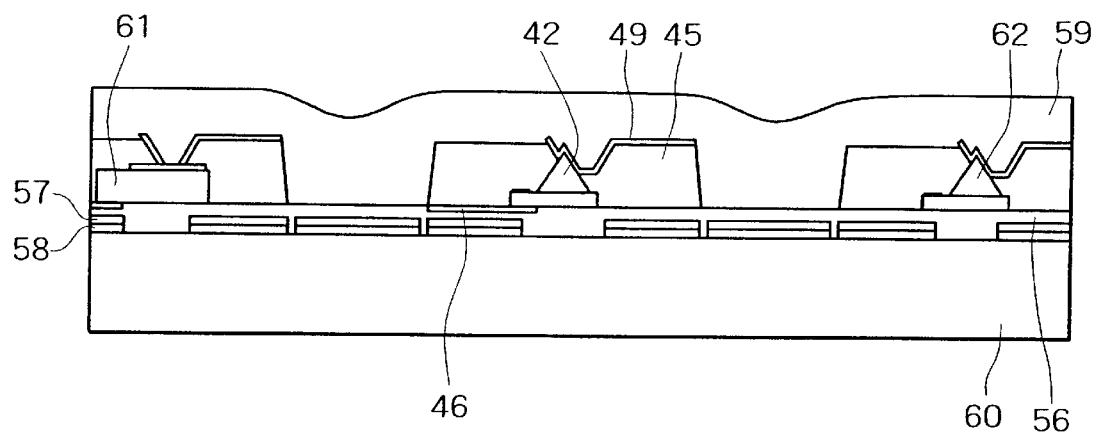
FIG. 16 is a schematic sectional view showing an insulating layer formation step.

FIG. 16 is a view showing a state in which light emitting diodes 42, 61, and 62 of three colors, that is, RGB are arrayed on the second substrate 60 and are coated with an insulating layer 59. By mounting each of the light emitting diodes 42, 61, and 62 on the second substrate 60 at a position shifted to a position of a desired color, a pixel composed of the light emitting diodes 42, 61 and 62 of the three colors can be formed with a pixel pitch fixed. The insulating layer 59 may be made from a transparent epoxy adhesive, an UV-curing type adhesive, or polyimide. The shapes of the light emitting diodes 42, 61, and 62 of three colors are not necessarily identical to each other. In the example shown in FIG. 16, the light emitting diode 61 of red, which has a structure having no hexagonal pyramid shaped GaN layer, is different in shape from each of the other light emitting diodes 42 and 62; however, in this stage, each of the light emitting diodes 42, 61, and 62 has been already covered with the adhesive layer 45 made from the resin to be formed into the resin molded chip, and therefore, the light emitting diodes 42, 61, and 62 can be handled in the same manner irrespective of the difference in device structure.

Figure 17:
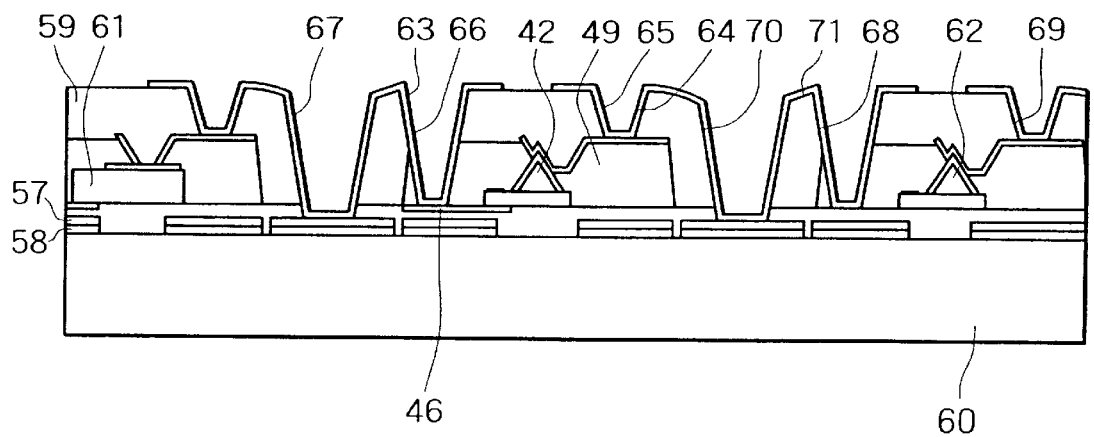
FIG. 17 is a schematic sectional view showing a wiring formation step.

FIG. 17 is a view showing a wiring forming step, in which openings 65, 66, 67, 68, 69, and 70 are formed in the insulating layer 59, and wiring portions 63, 64, and 71 for connecting electrode pads of anodes and cathodes of the light emitting diodes 42, 61, and 62 to the electrode layer 57 for wiring on the second substrate 60 side are formed. Since the areas of the electrode pads for each of the light emitting diodes 42, 61, and 62 (for example, the electrode pads 46 and 49 for the light emitting diode 42) are large, the shapes of the openings, that is, via-holes can be made large, and also the positioning accuracy of each via-hole may be rough as compared with a via-hole directly formed in each light emitting diode. When each of the electrode pads 46 and 49 has a size of about a 60 μm square, the via-hole having a diameter of about 20 μm can be formed. The via-holes are of three kinds connected to the wiring substrate, the anode electrode, and the cathode electrode. The depth of each via-hole is optimized by controlling the pulse number of a laser beam depending on the kind of the via-hole. A protective layer is then formed on the wiring, to accomplish a panel of an image display unit. The protective layer may be made from the transparent epoxy adhesive used for the insulating layer 59 shown in FIG. 16. The protective layer is heated to be cured, to perfectly cover the wiring. After that, a driver IC is connected to the wiring located at the end portion of the panel, to produce a drive panel.

In the above-described method of arraying light emitting devices, since the light emitting diodes 42 are already enlargedly spaced from each other on the temporary holding member 43, the relatively large electrode pads 46 and 49 can be provided by making use of the large pitch of the devices 42, and since the wiring is performed by making use of the relatively large electrode pads 46 and 49, even if the size of the final unit is significantly large as compared with the device size, the wiring can be easily formed. Also, according to the method of arraying light emitting devices in this embodiment, since each light emitting device is covered with the cured adhesive layer to be formed into a resin-molded chip, the electrode pads 46 and 49 can be accurately formed on the flat surface of the resin-molded chip and can extend over a region of the resin-molded chip wider than the device size, so that the handling of the electrode pads 46 and 49 at the time of transfer using the attracting jig in the second transfer step can be facilitated. Further, at the time of transfer of each light emitting diode 42 to the temporary holding member 43, the light emitting diode 42 can be relatively easily peeled by making use of decomposition of the GaN based material into Ga and nitrogen at the interface between GaN and sapphire, and therefore, the light emitting diode 42 can be certainly transferred by the effect of the above-described abrasion in combination with the effect of selective removal of the release agent layer 43.

As described above, according to the device transfer method of the present invention, selective transfer of light emitting devices can be certainly performed. To be more specific, only a light emitting device, from which a release agent has been removed, can be readily transferred to a second substrate side by the combination of the effect of an adhesive force of an adhesive and the effect of peeling the device from a first substrate side by laser abrasion. Such transfer of the light emitting devices from the first substrate side to the second substrate side can be simply, efficiently, and accurately performed.

According to the device array method of the present invention, since the method is carried out by making use of the above-described device transfer method, it is possible to efficiently, certainly transfer light emitting devices, and to smoothly perform enlarged transfer by transferring the light emitting devices from a first substrate side to a second substrate side in such a manner that the devices are enlargedly spaced from each other on the second substrate side with a pitch larger than a pitch of the devices on the first substrate side.

Similarly, according to the image display unit production method of the present invention, it is possible to transfer light emitting devices, which have been densely formed, that is, finely formed with a high degree of integration on a first substrate, onto a second substrate and re-array the devices thereon in such a manner that the devices are enlargedly spaced with each other with a pitch larger than a pitch of the devices on a first substrate side by making use of the above-described device transfer method, and hence to produce an accurate image display unit with a high productivity.

While the preferred embodiments of the present invention have been described using specific terms, such description is for illustrative purposes only, and it is to be understood that changes and variations may be made without departing from the spirit or scope of the following claims.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A device transfer method of transferring a plurality of devices arrayed on a first substrate to a second substrate, comprising the steps of:

covering said plurality of devices on said first substrate with a release agent;

selectively removing a portion of the release agent positioned on a device to be transferred;

placing said first substrate on a second substrate in such a manner that said devices arrayed on said first substrate face an adhesive layer previously provided on said second substrate;

irradiating said device from which the release agent has been removed from a back side of said first substrate; and peeling said second substrate from said first substrate.

2. A device transfer method according to claim 1, wherein the removal of the portion of the release agent positioned on said device to be transferred is performed by laser abrasion.

3. A device array method of re-arraying a plurality of devices, which have been arrayed on a first substrate, onto a second substrate, comprising:

a first transfer step of transferring said devices from said first substrate to a temporary holding member in such a manner that said devices are enlargedly spaced from each other on said temporary holding member with a pitch larger than a pitch of said devices when arrayed on said first substrate, and holding said devices on said temporary holding member; and a second transfer step of transferring said devices held on said temporary holding member to a second substrate in such a manner that said devices are more enlargedly spaced from each other on said second substrate with a pitch larger than a pitch of said devices when held on said temporary holding member;

wherein said first transfer step further comprises the steps of:

covering said plurality of devices on said first substrate with a release agent;

selectively removing a portion of the release agent positioned on a device to be transferred;

placing said first substrate on said temporary holding member in such a manner that said devices arrayed on said first substrate face an adhesive layer previously provided on said temporary holding member;

irradiating said device from which the release agent has been removed from a back side of said first substrate; and peeling said temporary holding member from said first substrate.

4. A device array method according to claim 3, wherein in said first transfer step, the enlarged pitch of said devices held on said temporary holding member is as large as about an integer multiple of the pitch of said devices arrayed on said first substrate; and in said second transfer step, the enlarged pitch of said devices arrayed on said second substrate is as large as about an integer multiple of the pitch of said devices held on said temporary holding member in said first transfer step.

5. A device array method according to claim 3, wherein said device is a semiconductor device made from a nitride semiconductor.

6. A device array method according to claim 3, wherein said device is a device selected from a light emitting device, a liquid crystal control device, a photoelectric transfer device, a piezoelectric device, a thin film transistor device, a thin film diode device, a resistance device, a switching device, a micro-magnetic device, and a micro-optical device.

7. An image display unit production method for producing an image display unit in which light emitting devices are arrayed in a matrix, comprising:

a first transfer step of transferring light emitting devices from a first substrate to a temporary holding member in such a manner that said light emitting devices are enlargedly spaced from each other on said temporary holding member with a pitch larger than a pitch of said light emitting devices when arrayed on said first substrate, and holding said light emitting devices on said temporary holding member; and a second transfer step of transferring said light emitting devices held on said temporary holding member to a second substrate in such a manner that said light emitting devices are more enlargedly spaced from each other on said second substrate with a pitch larger than a pitch of said light emitting devices when held on said temporary holding member; and a wiring formation step for forming wiring connected to said light emitting devices;

wherein said first transfer step further comprises the steps of:

covering said plurality of light emitting devices on said first substrate with a release agent;

selectively removing a portion of said release agent positioned on a light emitting device to be transferred;

placing said first substrate on said temporary holding member in such a manner that said light emitting devices arrayed on said first substrate face an adhesive layer previously provided on said temporary holding member;

irradiating said light emitting device from which the release agent has been removed from a back side of said first substrate; and peeling said temporary holding member from said first substrate.

* * * * *